(12) United States Patent
Gunadisastra

(10) Patent No.: US 6,289,477 B1
(45) Date of Patent: *Sep. 11, 2001

(54) FAST-SCAN-FLOP AND INTEGRATED CIRCUIT DEVICE INCORPORATING THE SAME

(75) Inventor: Peter Gunadisastra, Palo Alto, CA (US)

(73) Assignee: Adaptec, Inc., Milpitas, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/136,071

(22) Filed: Aug. 18, 1998

Related U.S. Application Data

(60) Provisional application No. 60/083,312, filed on Apr. 28, 1998.

(51) Int. Cl.[7] .................................................. G01R 31/28
(52) U.S. Cl. ..................... 714/724; 714/726; 324/158.1; 365/201
(58) Field of Search ..................... 714/726, 727, 714/724, 729; 324/158.1; 365/201

(56) References Cited

U.S. PATENT DOCUMENTS

| | | | |
|---|---|---|---|
| 5,202,625 | * 4/1993 | Farwell | 324/158.1 |
| 5,329,167 | * 7/1994 | Farwell | 365/201 X |
| 5,416,409 | * 5/1995 | Hunter | 324/158.1 |
| 5,719,878 | 2/1998 | Yu et al. | 714/726 |
| 5,889,788 | * 3/1999 | Pressly et al. | 714/726 |
| 5,909,450 | * 6/1999 | Wright | 714/724 |
| 6,014,762 | 1/2000 | Sanghani et al. | 714/718 |

* cited by examiner

Primary Examiner—Emmanuel L. Moise
(74) Attorney, Agent, or Firm—Martine & Penilla, LLP

(57) ABSTRACT

Disclosed is a scan-flop adapted for use in testing integrating of an integrated circuit's core logic and an integrated circuit device incorporating the same. Broadly, the scan-flop comprises a synchronous flip-flop having at least one input adapted to receive selected input data from input terminals of the scan-flop and at least one output operative in response to presence of a clocked enable signal to exhibit a logic state as determined by the selected input data. This output defines a data output terminal for the scan-flop. A logic circuit (e.g., an inverter) is electrically coupled to the flip-flop output and has an output node defining a scan output terminal for the scan-flop, which enables a substantial reduction in capacitive loading due to a scan test. A multiplexer operates in response to a select signal to transmit the selected input data to the flip-flop's input. An integrated circuit device is also disclosed having a plurality of I/O pins defined on a semiconductor die and a logic core disposed therein. The logic core includes at least a first logic chain electrically connected between I/O pins and broadly includes two scan-flops and a logical array electrically interposed therebetween.

23 Claims, 7 Drawing Sheets

US 6,289,477 B1

FAST-SCAN-FLOP AND INTEGRATED CIRCUIT DEVICE INCORPORATING THE SAME

This Application claims benefit of Provisional No. 60/083,312 filed Apr. 28, 1998.

BACKGROUND OF THE INVENTION

1. Field of the Invention

This invention relates generally to integrated circuits and more particularly concerns the use of scan-flops in integrated circuits to maximize fault coverage during testing procedures, without sacrificing chip speed.

2. Description of the Related Art

In an effort to remain competitive in the marketplace, chip manufacturers are constantly striving to optimize the design and efficiency of their integrated circuits (ICs) by increasing both chip speed and the density of internal circuit components. Commensurate with meeting these objectives is a concerted effort on the part of chip manufacturers to maximize fault coverage when testing their IC designs. Presently, a 95% fault coverage is common, with this percentage expected to increase to at least 97% fault coverage in the near future. Ideally, of course, chip manufacturers strive for 100% fault coverage.

Testing of ICs during production has become more difficult and expensive due to the limited access from the I/O pins to the chip's logic core and the limited time available for each IC to be on a tester. A full-scan method has become an industry standard to increase fault coverage while decreasing test time during production. The full-scan approach generally involves the incorporation of scan-flops fabricated into an IC chip throughout its logic core. A scan-flop, sometimes referred to as a scan-flop cell, is essentially a flip-flop with the addition of a multiplexer that permits the IC to operate in both a test mode and a functional mode. As such, full-scanning of a chip's logic core involves replacing-each flip-flop with a scan-flop. However, while the utilization of scan-flops facilitates testing the integrity of the logic core, the additional logic and routing inherent in existing scan-flops necessarily increases the propagation delay through their associated flip-flops, thereby-reducing the functional speed of the IC.

This propagation delay is attributed to two factors that include scan muxing (i.e., multiplexing) and scan routing. Scan muxing delay can be reduced by optimizing the design of a scan-flop's multiplexer, while scan routing delay is generally avoided utilizing the scan-flop's inverted output (NQ) provided it is not being used. It is typical, however, for most IC designs to rely upon the scan-flop's inverted output NQ during functional operations, thereby resulting in increased scan routing delay.

With initial reference to FIGS. 1(a) and 1(b), the incorporation of existing scan-flop designs into an IC, for the purpose of testing the logic core may now be better appreciated, as well as the drawbacks associated therewith. In FIG. 1(a) an integrated circuit chip 10 is schematically shown to have a plurality of input pins 14 and output pins 16. Within chip 10 is the logic core consisting of various logic chains, such as logic chains 18 and 20. Each logic chain includes a plurality of scan-flops and their associated logic arrays. For example, logic chain 18 includes scan-flops 21–23 and their associated logic arrays 24 and 25, while logic chain 20 includes scan-flops 26–28 and their associated logic arrays 29 and 30. Of course, it should be readily appreciated that FIG. 1(a) is a somewhat simplified representation of a typical IC chip 10 in that existing designs would necessarily include many more such logic chains and more associated circuitry components.

Chip 10 is operative in both a test mode and a functional mode. When operating in the test mode, it is desirable to test the integrity of the chip's various logic arrays in a time efficient manner and with a high fault coverage, as discussed above, so that chip 10 exhibits reliable performance characteristics when in the functional mode. To this end, and as known in the art, the testing procedure involves the use of an automatic test pattern generation (ATPG) simulation to inject a test vector into the chip to ascertain whether there are any problems within the particular logic arrays residing between the scan-flops. More specifically, the ATPG creates the test vectors which are simultaneously presented to input pins 14 of chip 10. The test vectors are initially loaded into the scan-flops of the respective logic chains in such a manner that the internal logic arrays within the chains are bypassed.

This testing procedure may best be appreciated with reference now to FIG. 1(b) of the prior art which, for representative purposes, shows only a portion of logic chain 18 in FIG. 1(a). Here it may be seen that logic array 24 is interposed in electrical communication between scan-flops 21 and 22. Scan-flop 21 includes a multiplexer 32 and a synchronous flip-flop 34. Likewise, scan-flop 22 includes a multiplexer 42 and a synchronous flip-flop 44. Flip-flops 34 and 44 may be positive-edge triggered D flip-flops, as shown. When selected for test mode operation, the test vector is injected into logic chain 18 at input pin 14 upon the transition of a clocked enable signal on line 50 from a logic "low" to a logic "high". The test vector proceeds along a scan path that bypasses logic array 24 and is sequentially stored into each of the scan-flops, including scan-flops 21 and 22. That is, the test vector is initially transmitted to the serial input SI of scan-flop 21 and proceeds through multiplexer 32 for storage into flip-flop 34. From here, the test vector is transmitted along communication line 52 from the inverted output NQ of flip-flop 34 to the serial input SI of flip-flop 22, thereby bypassing logic array 24. The test vector then passes through the second scan-flop's multiplexer 42 for storage into flip-flop 44. The test vector is sequentially stored in the remaining scan-flops of logic chain 18 in a similar manner.

Once the test vector has been initially loaded into the scan-flops of logic chain 18, chip 10 is selected for functional mode operation to pass the test vector into each of the logic arrays. For example, the test vector stored in flip-flop 34 of scan-flop 21 is passed into logic array 24 along either or both of the flip-flop's Q output line 54 or NQ output line 56. Logic array 24 processes the information and transmits its results along data line 58 to second scan-flop 22, and so on down the logic chain. Chip 10 is then returned to its test mode and generates an output test vector for logic chain 18 at output pin 16 shown in FIG. 1(a). The input test vector and the output test vector are then compared by the ATPG to ascertain if there are any discrepancies, indicating a fault within one of the logic arrays that forms part of logic chain 18.

While the full-scan approach discussed above is widely used, it does have inherent drawbacks. One of these drawbacks is that undesirable propagation delay occurs in communication line 52 of the scan path, i.e. the one that bypasses logic array 24 during initial loading of the test vector. In sub-micron technology, wiring capacitance of communication line 52 is generally more significant than the input capacitance of logic array 24. Because communication line 52 is relatively long in that it bypasses logic array 24, its wiring capacitance can double the load seen by inverted output NQ of flip-flop 34. This not only results in lost speed during the testing of logic chain 18, but also detrimentally impacts chip speed during functional mode operation because the inverted output NQ of each of the flip-flops sees an increased load at all times.

Another inherent drawback of the full-scan approach discussed above is due to the necessary incorporation of a multiplexer within each of the scan-flops to permit test mode operation. The mere existence of these multiplexers, and the internal transistors associated with them, also causes additional propagation delay during test mode and functional mode operation of the chip.

In view of the foregoing, what is needed is a new and improved scan-flop design for use in an integrated circuit to increase testing efficiency of the circuit's core logic by reducing test time without jeopardizing test results. It would also be desirable for such a scan-flop to reduce propagation delay during functional mode operation of the integrated circuit. The present invention is directed to meeting these needs, among others.

SUMMARY OF THE INVENTION

Broadly speaking, the present invention fills these needs by providing a new and improved scan-flop adapted for use in testing the integrity of an integrated circuit's core logic, as well as an integrated circuit device incorporating this improved scan-flop design so that the IC's internal logic arrays may be tested in a time efficient manner without reducing large functional speed. The various invented embodiments of the present invention are describe below.

In one embodiment, a scan-flop is provided which broadly includes a flip-flop, a multiplexer and a logic circuit. The flip-flop has at least one input adapted to receive selected input data from a data input terminal of the scan-flop, and a flip-flop output operative to exhibit a logic state as determined by the selected input data. This flip-flop output defines an output terminal for the scan-flop. Preferably, a synchronous flip-flop is provided having a plurality of flip-flop outputs, each defining a respective data output terminal for the scan-flop and operative in response to the presence of a clocked enable signal to exhibit one of a first and second logic state as determined by condition of the selected input data. To this end, the flip-flop may be a D flip-flop, T flip-flop, R-S flip-flop, J-K flip-flop, or the like.

The multiplexer operates in response to a select signal to transmit the selected input data to the flip-flop's input. The multiplexer is, therefore, preferably provided with a plurality of multiplexer inputs in electrical communication with the scan-flop's data input terminals and a select input in electrical communication with the scan-flop's select input terminal.

A scan output terminal for the scan-flop is formed by electrically connecting a logic circuit between a selected one of the flip-flop outputs and its associated data output terminal. This logic circuit may include a gate element, such as a power inverter. Of course, other types of gate elements, such as an AND gate, an OR gate, an XOR gate, etc. could be readily employed. As such, the logic circuit has at least one input lead and one output lead and it is preferred that the input lead have a length that is less than about 10 microns (for a 0.25 micron technology design) to reduce capacitive loading on the flip-flop's output.

In another embodiment, an integrated circuit device is provided which broadly includes a semiconductor die, a plurality of I/O pins defined on the semiconductor die, and an internal logic core. The logic core includes a first logic chain electrically connected between an interconnected pair of the input pins and output pins, and this logic chain is operative in response to a clocked enable signal present at another of the input pins to receive selected input data and to generate output data at an output pins. The logic chain broadly includes a pair of scan-flops and a logic array electrically interposed therebetween. Each scan-flop has at least one data input terminal, at least one data output terminal, a select input terminal, a data output terminal and a scan output terminal, as discussed above.

The data output terminal of the first scan-flop is interconnected through the combinational logic array to the data input terminal of the second scan-flop thereby to define a functional data path between the paired I/O pins. The scan output terminal of the first scan-flop is mixed to the select input terminal of the second scan-flop independently of the logic array to define a logic gate scan path between the paired I/O pins. With such a construction, the integrated circuit device is operative in a test mode to transmit selected input data in the form of a test vector to each scan-flop along the logic gate scan path so that the logic array is bypassed. The device is further operative in a functional mode to transmit selected input data in the form of functional data through the logic chain along the functional data path for processing by the logic array. A logic circuit is associated with each of the flip-flops in the logic chain, as discussed, above and is electrically coupled between one of the flip-flop's outputs and the scan output terminal of its associated scan-flop so as to reduce a capacitive loading effect on the flip-flop output when the integrated circuit is in the functional mode.

In yet another embodiment of the present invention, the integrated circuit chip's logic core includes a plurality of logic chains respectively interconnected for electrical communication between associated ones of the I/O pins. Each of these logic chains is operative to receive selected input data and to generate output data in response thereto. To this end, each logic chain preferably includes a plurality of logic arrays and a plurality of scan-flops as discussed above. In this embodiment, the scan-flops are electrically coupled independently of the logic arrays to define a scan path between associated ones of the I/O pins and each of the logic arrays is electrically connected between adjacent ones of the scan-flops thereby to define the functional data path between the associated I/O pins.

The present invention is also directed to a methodology of fabricating an integrated circuit device into a semiconductor die to maximize fault coverage thereof during test mode operation without sacrificing large processing speed during functional mode operation. This methodology includes an operation of forming a semiconductor die that has a logic core including a plurality of logic chains each interconnected for electrical communication between paired ones of the integrated circuit devices input and output pins. Each of these logic chains include a plurality of scan-flop and a plurality of logic arrays. Each of the scan-flops further includes a serial input terminal, a data input terminal, a multiplexer, a flip-flop provided with a flip-flop output, at least one data output terminal electrically coupled to the flip-flop output, and a scan output terminal interconnected to the flip-flop output by a logic gate.

The methodology also includes an operation of electrically interconnecting each of the logic arrays between the data output terminal of a preceding one of the scan-flops in the logic chain and the data input terminal of a succeeding one of the scan-flops in the logic chain. The methodology further includes an operation of electrically isolating the logic arrays from their associated scan-flops in the logic chain. This is accomplished by coupling the scan output terminal of each preceding one of the scan-flops to the serial input terminal of each succeeding one of the scan-flops, thereby to reduce capacitive loading effects on the data output terminal of each flip-flop during testing mode operation and functional mode operation of the integrated circuit device.

Advantageously, the present invention resolves the drawbacks of full scanning, which is attributed to existing scan-flop designs, by providing a new and improved fast scan-flop design which allows an integrated circuit's core logic to be tested more efficiently without sacrificing functional chip speed. Other aspects of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE PREFERRED EMBODIMENTS

An invention is described for a new and improved fast scan-flop, as well as an integrated circuit device incorporating the same. It will be obvious, however, to one skilled in the art that the present invention may be practiced without some or all of these specific details. In other instances, well known process operations have not been described in detail in order not to unnecessarily obscure the present invention.

The present invention, in one sense, is directed to a fast scan-flop for use in integrated circuits to maximize fault coverage during testing procedures without sacrificing chip speed. The present invention also concerns an integrated circuit device employing such an improved fast scan-flop design and a methodology of testing integrated circuit devices during production in a time efficient manner while optimizing fault coverage. While the exemplary embodiments of the present invention are described with respect to a scan-flop having a bistable multivibrator circuit in the form of a synchronous D flip-flop, the principal features of the present invention are readily applicable to other types of bi-stable multivibrator circuits operative to switch from one state to another. From the description to follow, it should become readily apparent to the ordinarily skilled artisan in this field that additional aspects and applications of the present invention are contemplated, without departing from the inventive concepts contained herein.

Figure 2:
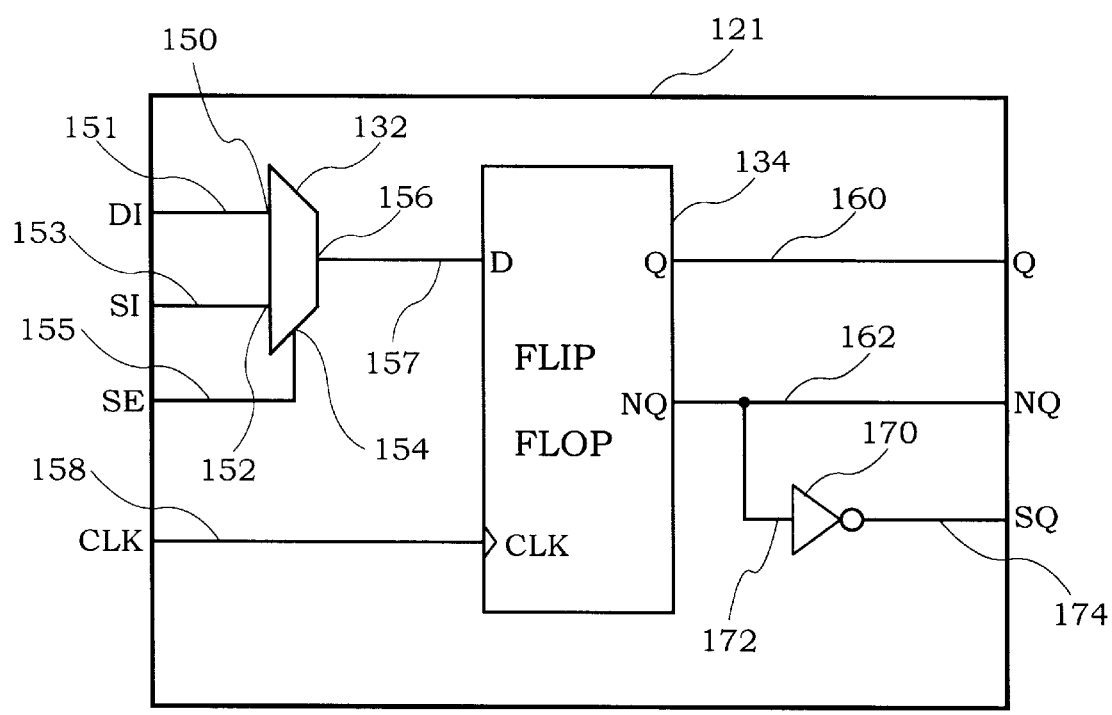
FIG. 2 is a block diagram of a fast scan-flop constructed according to the teachings of the present invention.

With initial reference to FIG. 2, a fast scan-flop 121 is disclosed which is adapted for use in testing the integrity of an integrated circuit's core logic. Scan-flop 121 has a plurality of input terminals and a plurality of output terminals and broadly includes a multiplexer 132 and a synchronous flip-flop 134 electrically interconnected therebetween. More particularly, scan-flop 121 has a data input DI and a serial input SI that are respectively in electrical communication with multiplexer inputs 150 and 152 along communications lines 151 and 153. Scan-flop 121 also has a select input terminal SE in electrical communication with the multiplexer's select input 154 via communication line 155. Multiplexer 132 also has an output 156 in electrical communication with data input D of flip-flop 134 along communication line 157. Multiplexer 132 is operative in response to a select signal present at input terminal SE to selectively transmit input data from either input terminal DI or input terminal SI along communication line 157 to input D of flip-flop 134. Exemplary configurations for multiplexer 132 are described more thoroughly below with reference to FIGS. 3 and 4, but it should be readily appreciated that other multiplexer configurations could also be utilized.

Flip-flop 134 is adapted to receive the selected input data from multiplexer 132 and has a plurality of flip-flop outputs Q and NQ which are each operative in response to presence of a clocked enable signal to exhibit either a logic state "low" or a logic state "high" as determined by the selected input data. To this end, flip-flop 134 has a clock input CLK in electrical communication with a clock input terminal CLK of scan-flop 121 via communication line 158. While flip-flop 134 is shown in FIG. 2 to be a synchronous, positive-edge triggered D flip-flop which operates to toggle its output states when set in synchronization by the transition of the clocked enable signal from a logic state "low" to a logic "high", the present invention readily contemplates that other types of flip-flops can be readily employed. These might include, by way of example only, T flip-flops, R-S flip-flops and J-K flip-flops.

The outputs Q and NQ of flip-flop 134 are respectively connected to the corresponding output terminals Q and NQ of scan-flop 121 via communication lines 160 and 162. Scan-flop 121 additionally includes a scan output terminal SQ which is formed by electrically coupling a logic circuit 170 to a selected one of flip-flop outputs Q and NQ. In FIG. 2, logic circuit 170 is a gate element, in the form of an inverter which is electrically coupled to flip-flop output NQ to define scan output terminal SQ. As such, logic circuit 170 has an input lead 172 connected to flip-flop output NQ and an output node 174 connected to scan output terminal SQ. In one embodiment, the input lead 172 is maintained as a relatively short wire in order to reduce wire capacitive loading.

As explained more thoroughly below with reference to FIG. 3, logic circuit 170 functions to reduce wiring capacitive loading when an integrated circuit device incorporating one or more of scan-flops 121 is in a functional mode. Logic circuit 170 is preferably a small inverter, but it should be readily understood that other types of logic gate elements, such as AND gates, NAND gates, OR gates, NOR gates, XOR gates and the like could instead be coupled to a flip-flop output to generate scan output terminal SQ. This is because an inverter essentially cuts-off the loading effect on the flip-flop output (Q or NQ). Moreover, it should be appreciated that an appropriate logic circuit 170 can be connected to either of the flip-flop outputs Q or NQ to effectuate this purpose of reducing loading effects. It is preferred, however, that logic circuit 170 be connected to flip-flop output NQ because, statistically, this output is not utilized as much in integrated circuit designs as Q. In fact, in order to accomplish this objective, it is also possible to construct a scan-flop whose internal flip-flop has only a single flip-flop output with a logic circuit electrically coupled thereto so that the scan-flop only has two output terminals, for example Q and SQ.

Figure 3:
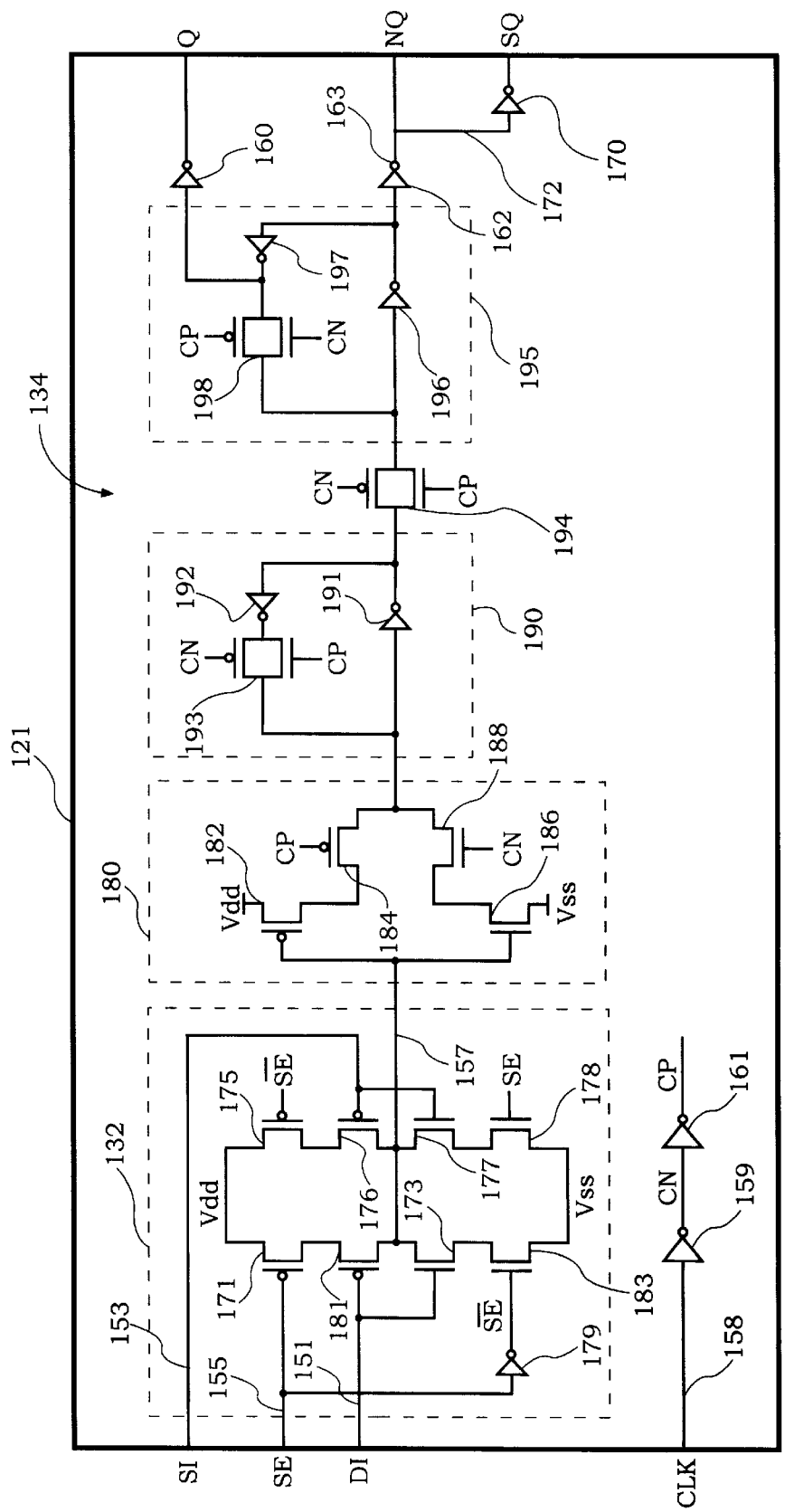
FIG. 3 is a schematic view illustrating the internal circuitry for the fast scan-flop of the present invention.

The internal circuitry for one possible construction of the fast scan-flop of the present invention may be seen now with reference to FIG. 3. With the exception of the inclusion of logic circuit 170 to generate the scan output terminal SQ, scan-flop 121 is similar to a "Q35 Scan Flop" available from Adaptec, Inc. of Milpitas, Calif.

Power is supplied to scan-flop 121 at rail voltage $V_{dd}$, which may be between about 3.3 volts and 5 volts, and supply voltage $V_{ss}$ (i.e., ground rail). The clocked enable signal is transmitted along communication line 158 through a series of inverters 159 and 161 which, respectively, produce the negative edge clock signal CN and positive edge clock signal CP. As noted above, electrically interposed between the input and output terminals of scan-flop 121 are multiplexer 132 and flip-flop 134. Multiplexer 132 is designed so that it occupies minimum silicon area with a relatively few number of transistors. The transistor sizes are selected so that the propagation delay along the functional data path of scan-flop 121 when it is in the functional mode is less than the propagation delay associated with the scan path therethrough when in the testing mode.

As shown in FIG. 3, multiplexer 132 includes an arrangement of transistors 171–178. PMOS transistors 171,181 transistors 173 and 183 are connected in series between rail voltage $V_{dd}$ and supply voltage $V_{ss}$. Likewise, PMOS transistors 175, 176 and NMOS transistors 177 and 178 are connected in series between the rail voltage $V_{dd}$ and supply voltage $V_{ss}$.

The select input terminal SE of scan-flop 121 is connected directly to the gates of PMOS transistor 171 and NMOS transistor 178. The select input terminal SE is also connected to the gate of NMOS transistor 183 and PMOS transistor 175 via an appropriate inverter 179 to present an inverted select signal SE thereto. When scan-flop 121 is selected for functional mode operation, selected input data is transmitted to multiplexer 132 via communication line 153 which electrically interconnects the gate of,PMOS transistor 172 and the gate of NMOS transistor 173 to the data input terminal DI of scan-flop 121. When selected for test mode operation, selected input data is presented to the gates of PMOS transistor 176 and NMOS transistor 177 via communication line 155 which interconnects these gates to the serial input terminal SI of scan-flop 121.

The output of multiplexer 132 via communication line 157 is connected to flip-flop 134 which includes a tri-state inverter 180 and storage elements 190 and 195 and transmission gate 194. Tri-state inverter 180 includes PMOS transistors 182 and 184 that have their gates connected to communication line 154, and have terminals connected to terminals of NMOS transistors 186 and 188. Rail voltage $V_{dd}$ is connected to the drain of PMOS transistor 182 and supply voltage $V_{SS}$ is connected to the source of NMOS transistor 186. The positive edge of the clocked enable signal CP is presented to the gate of PMOS transistor 184 and the negative edge of the clocked enable signal CN is presented to the gate of NMOS transistor 188.

Tri-state inverter 180 is connected in series with storage element 190, and storage element 190 includes an inverter 191 connected to an input of inverter 192 that outputs to a transmission gate latch 193. Transmission gate latch 193 is formed by a PMOS transistor and an NMOS transistor having their drains and sources coupled together and, respectively, triggered by CN and CP.

Storage element 190 is connected in series with storage element 194 which also includes a parallel arrangement of PMOS and NMOS transistors respectively triggered by CN and CP. Transmission gate 194 is connected between storage element 195 and storage, element 190. Storage element 195 includes an inverter 196 that has an output that is connected to an input of an inverter 197. The output of inverter 197 then leads to a transmission gate latch 198. An inverter 160 is electrically connected to a node between inverter 197 and transmission gate latch 198 to generate the scan-flop's Q output terminal and an inverter 162 is electrically connected to a node between inverters 196 and 197 to generate the scan-flop's NQ output terminal. As discussed above with reference to FIG. 2, the scan output terminal SQ of scan-flop 121 is formed by electrically coupling inverter 170 to the output 163 of inverter 162 to define a short communication line 172 (input lead) therebetween. The actual length of communication line 172 (input lead) necessarily depends on the sub-micron technology of the devices being fabricated, but for a 0.25 micron technology design the length should preferably be less than about 10 microns, and most preferably less than about 0.8 microns.

Figure 4:
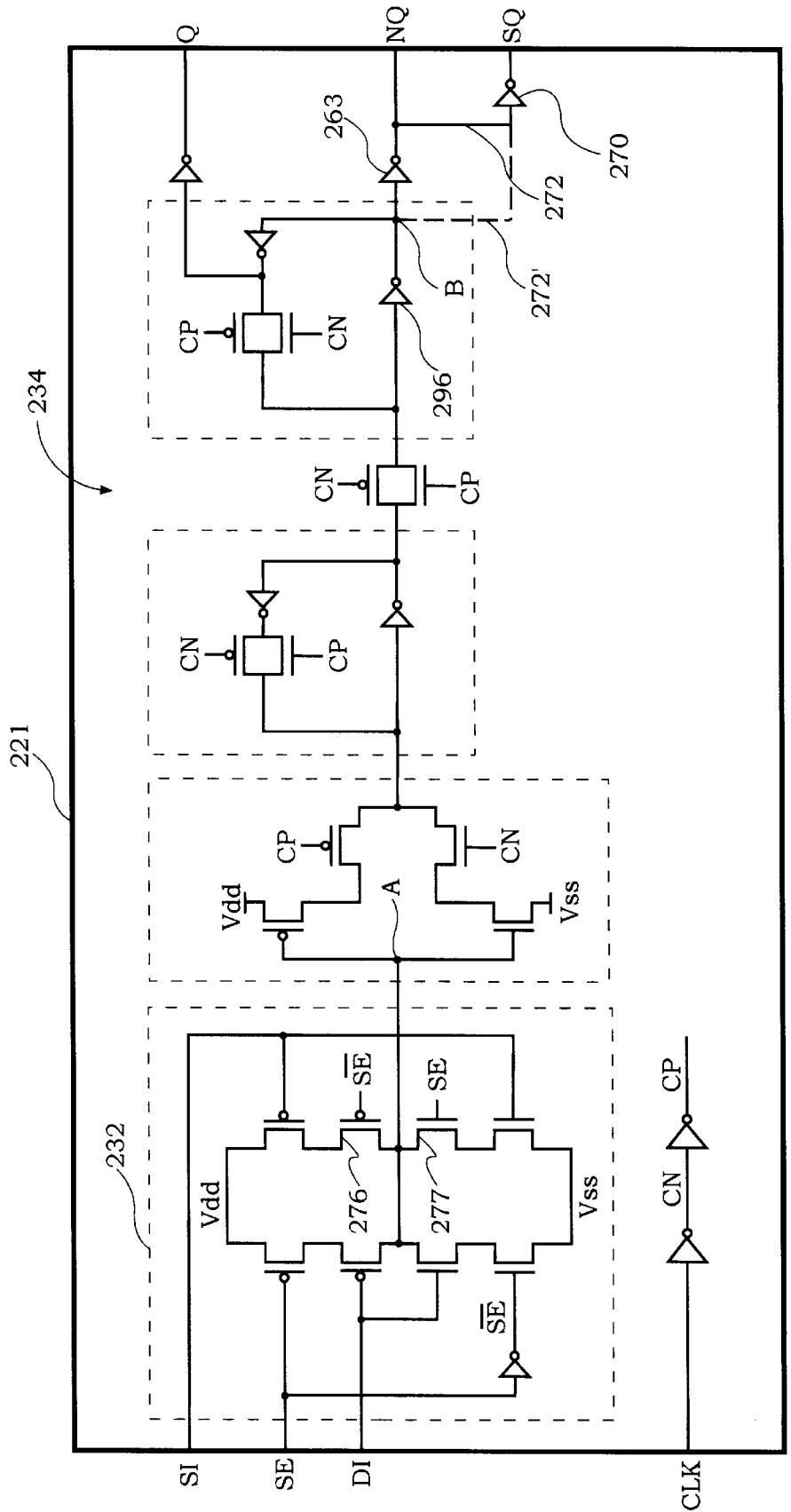
FIG. 4 is a schematic view illustrating an alternative construction for the fast scan-flop's internal circuitry.

An alternative construction for the internal circuitry of the scan-flop of the present invention is shown in FIG. 4. Here, the flip-flop 234 of scan-flop 221 is identical to the flip-flop 134 of scan-flop 121. The scan-flop's multiplexer 232, however, is designed somewhat differently. Since, as noted above with reference to FIG. 3, the logic gate scan path through the scan-flop can have a longer delay, the PMOS and NMOS transistors between SI and SE can be swapped, as shown. The benefit of this is that it results in reduced loading on point "A" during functional mode operation because PMOS transistor 276 and NMOS transistor 277 are generally always off. During scan operation, the select input signal SI necessarily passes an extra stage of transistors, but the additional delay is not critical because scan testing speed is only in the range of 5 MHz. The 5 MHz speed during testing should be contrasted with speeds ranging up to 400 MHz and higher during functional mode operation.

FIG. 4 also illustrates that it is possible to eletrically couple power inverter 270 at a junction "B" between inverters 296 and 263 to define a short communication line therebetween, as represented by dashed line 272'. However, this is not the most preferred connection because such a connection from point "B" may slow down the triggering of the, scan-flop's output terminals Q and NQ.

Figure 5:
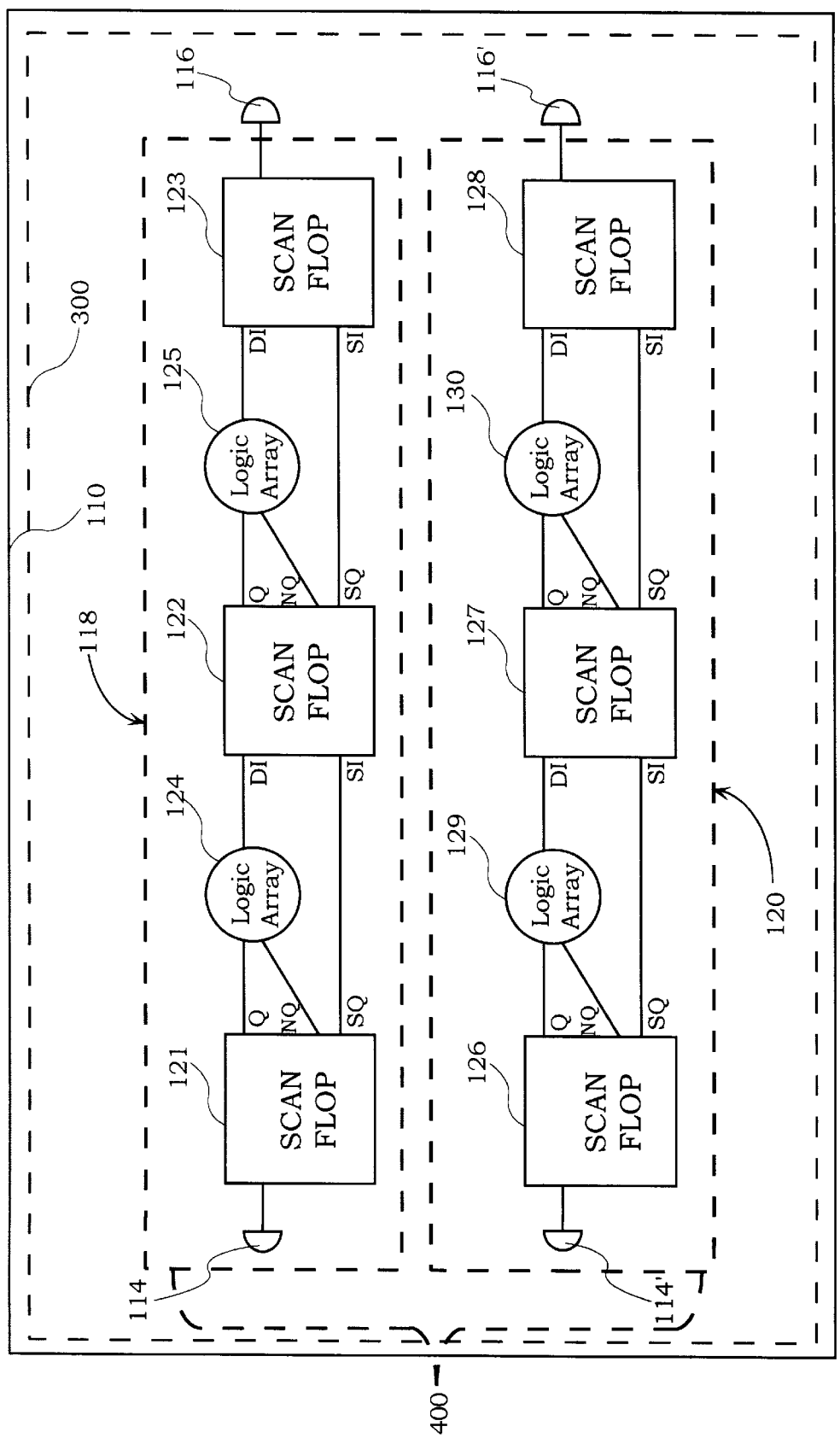
FIG. 5 is a block diagram of an integrated circuit chip constructed according to the teachings of the present invention, and showing a plurality of logic chains electrically connected between associated one's of the chips input and output pins.

With the foregoing descriptions in mind pertaining to the design possibilities for the fast scan-flop of the present invention, the advantages of incorporating the fast scan-flop into a integrated circuit device for the purpose of testing core logic may now be better appreciated. With reference then to FIG. 5, an integrated circuit device, in the form of chip 110, is schematically shown to have a plurality of input pins 114 and 114' and output pins 116 and 116' defined on a semiconductor substrate. Formed within chip 110's semiconductor die 300 is a logic core 400 which includes a plurality of logic chains, such as logic chains 118 and 120, respectively interconnected for electrical communication between paired ones 114, 116 and 114', 116' of the input and output pins. Each of logic chains 118 and 120 is operative to receive selected input data and to generate output data in response thereto. To this end, each of logic chains 118 and 120 includes a plurality of scan-flops and their associated logic arrays. For example, logic chain 118 includes scan-flops 121–123 and their associated logic arrays 124 and 125, while logic chain 120 includes scan-flops 126–128 and their associated logic arrays 129 and 130. Of course, FIG. 5 is a somewhat simplified representation of a typical integrated circuit chip 110 in that existing designs might necessarily include many more such logic chains and associated circuitry components. In addition, the illustrated sizes of the scan-flops and logic arrays that include combinational logic are not actually drawn to their correct relative sizes. For example, the illustrated logic arrays in typical designs may occupy substantially more chip space than that occupied by the scan-flop circuitry.

Scan-flops 121 and 122 in logic chain 118 are electrically coupled independently of logic array 124 by connecting the scan output terminal SQ of scan-flop 121 to the serial input terminal SI of scan-flop 122. Similarly, scan-flop 122 and scan-flop 123 are electrically coupled independently of logic array 125 by connecting the scan output terminal SQ of scan-flop 122 to the serial input terminal SI of scan-flop 123. Similar interconnections between the scan-flops 126–128 and the logic arrays 129 and 130 associated with logic chain 120 are also shown in FIG. 5. By utilizing any one of the possible designs for the scan-flops discussed above, fault coverage during testing of chip 110 can be enhanced without sacrificing chip speed during functional mode operation.

Figure 1A:
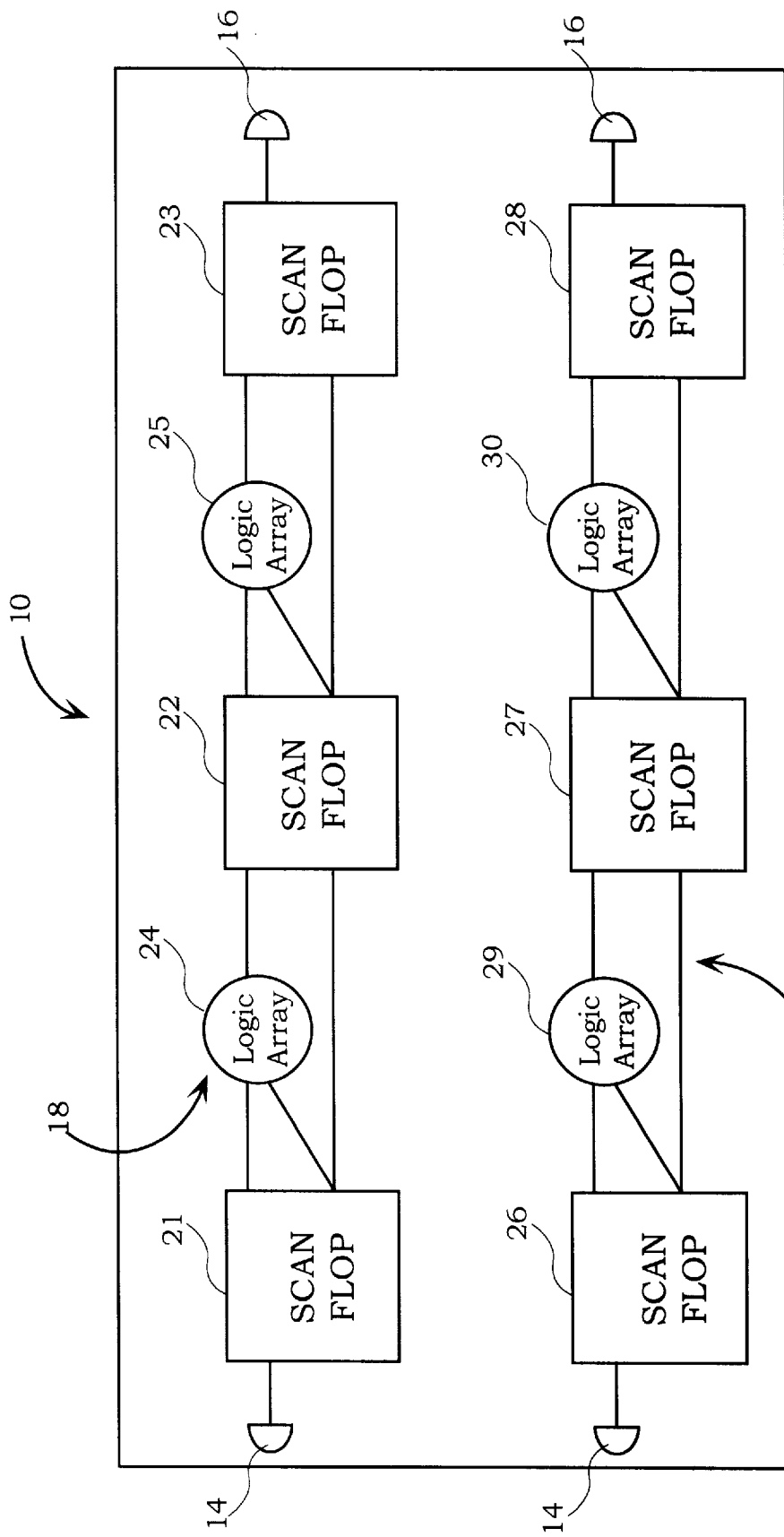
FIG. 1(a) is a block diagram of an integrated circuit chip constructed according to the prior art and showing a plurality of logic chains electrically connected between associated ones of the chip's input and output pins.
Figure 1B:
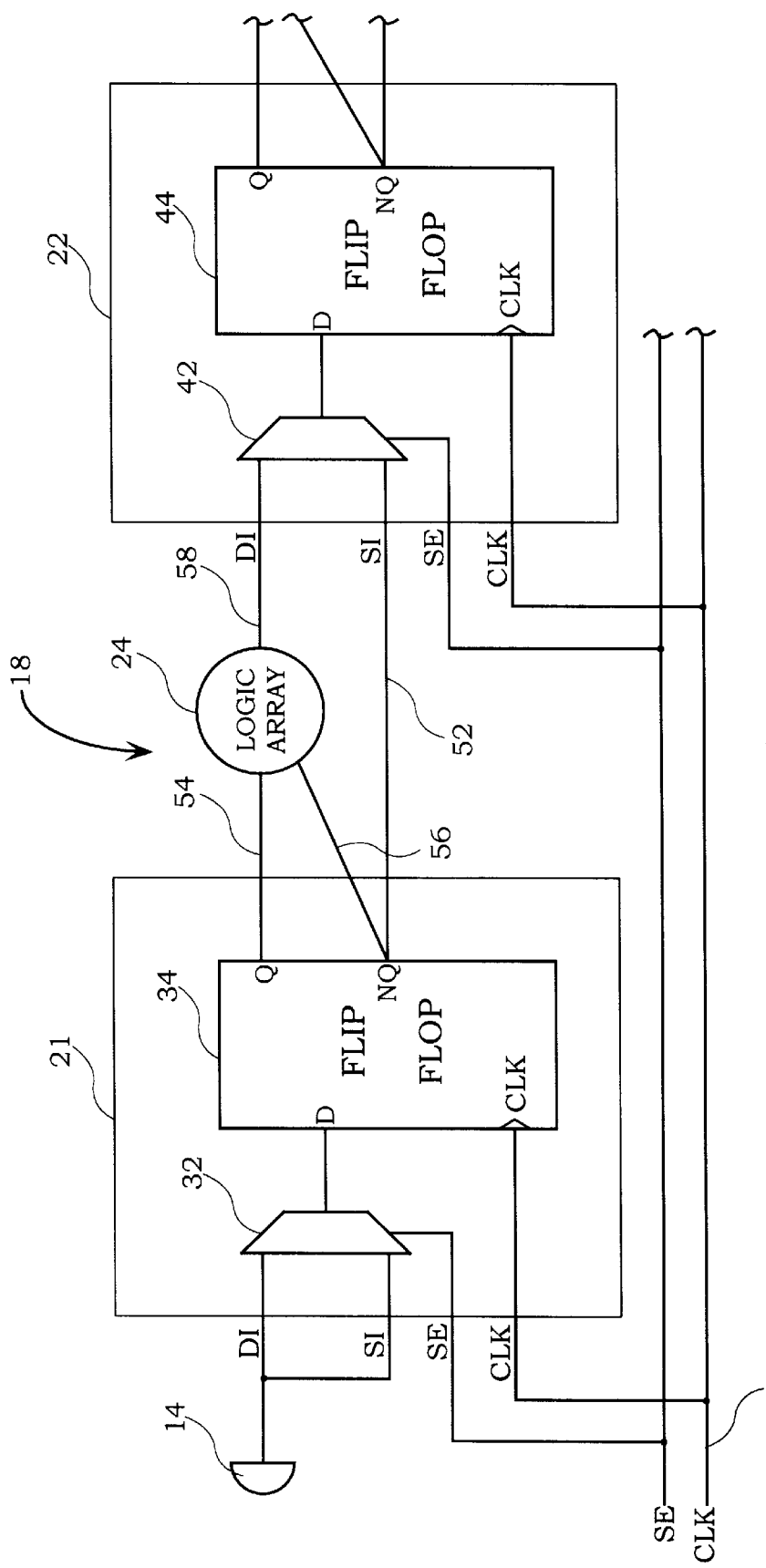
FIG. 1(b) is an enlarged block diagram of a portion of a representative one of the logic chains in FIG. 1(a), and specifically showing the interconnection between two of the logic chains' scan-flops and their associated logic array.

As with chip 10 discussed in the background section with reference to FIGS. 1(a) and 1(b) of the prior art, chip 110 is operative in both test mode and a functional mode. When in the test mode, it is desirable to test the integrity of chip 110's various logic arrays in a time efficient manner and with a high fault coverage so that chip 110 exhibits reliable performance characteristics in the functional mode.

Figure 6:
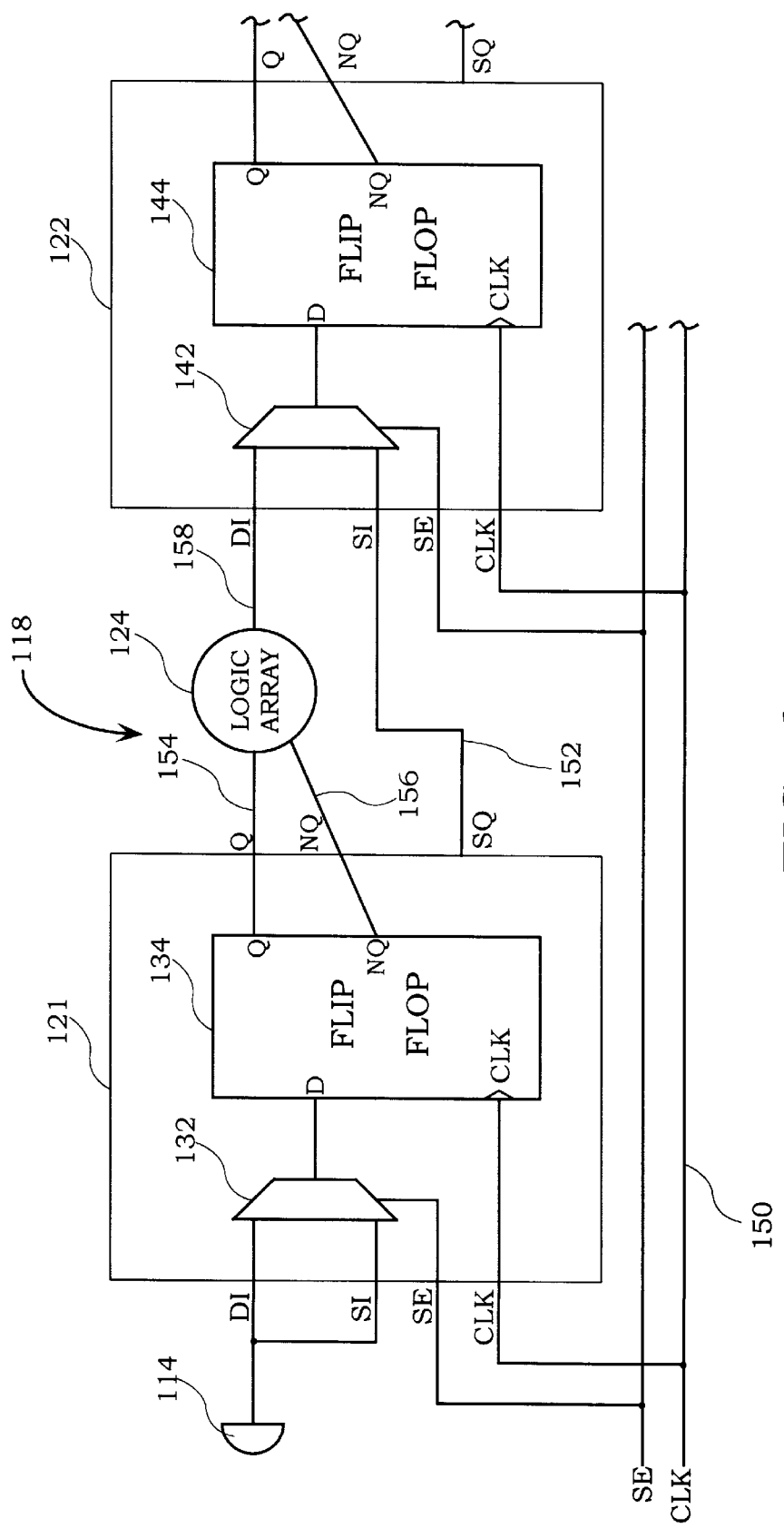
FIG. 6 is an enlarged diagrammatic view showing the interconnection in a logic chain between two scan-flops constructed according to the present invention and their associated logic array.

For representative purposes, FIG. 6 shows only a portion of logic chain 118 in FIG. 5 and specifically shows the interposition of logic array 124 between scan-flops 121 and 122. These scan-flops are constructed as discussed above in FIG. 2 so that scan-flop 121 includes multiplexer 132 and synchronous flip-flop 134 and scan-flop 122 includes multiplexer 142 and synchronous flip-flop 144. When selected for test mode operation, the test vector generated by the ATPG (Automatic Test Pattern Generation) simulation is injected into logic chain 118 at input pin 114 upon the transition of a clock signal on line 150 from a logic "low" to logic "high". The test vector proceeds along a scan path that bypasses logic array 124 and is sequentially stored into each of the scan-flops, including scan-flops 121 and 122. That is, the test vector is initially transmitted to the serial input terminal SI of scan-flop 121 and proceeds through multiplexer 132 for storage into flip-flop 134. From here, the test vector is transmitted along communication line 152 from the scan output terminal SQ of scan-flop 121 to the serial input terminal SI of scan-flop 122, thereby bypassing logic array 124. The test vector then passes through the second scan-flop's multiplexer 142 for storage into flip-flop 144. The test vector from the ATPG is sequentially stored into the remaining scan-flops of logic chain 118 in a similar manner.

Once the test vector is loaded into the scan-flops of logic chain 118, chip 110 is selected for functional mode operation to pass the test vector into each of the logic arrays. For example, the test vector stored in flip-flop 134 of scan-flop 121 is passed into logic array 124 along either or both of flip-flop 134's Q output line 154 or NQ output line 156. Logic array 124 processes the information and transmits its results along data line 158 to second scan-flop 122, and so on down the logic chain. Chip 110 is then returned to its test mode and generates an output test vector for logic chain 118 at output pin 116 shown in FIG. 5. The input test vector and output test vector are then compared by the ATPG to ascertain if there are any discrepancies, indicating a fault within one of the logic arrays that forms part of logic chain 118.

The incorporation of a logic circuit into each of scan-flops 121 and 122 to form their scan output terminals SQ, as discussed above, addresses many of the problems associated with the prior art, thereby increasing the efficiency of chip 110. For example, there is no longer the negative capacitive loading effect on the output NQ of flip-flops 134 and 144 because they are no longer directly coupled to the serial input terminal SI of the next scan-flop in the logic chain. Rather, they are coupled to their associated inverters via output SQ. As such, the added capacitive loading associated with the connection in the prior art is no longer present, thereby resulting in reduced propagation delay during the functional mode operation of chip 110. Chip speed during functional mode operation is, therefore, not sacrificed. Moreover, the improved designs of the multiplexers associated with the scan-flops also reduces the propagation delay therethrough during functional mode operation of chip 110.

With the foregoing description in mind with reference to the exemplary embodiment,; of the present invention, it should be appreciated that a method of fabricating a integrated circuit device into a semiconductor die for the purpose of maximizing fault coverage during test mode operation, without the sacrifice of processing speed during functional mode operation, is also contemplated. This methodology comprises the operations of forming into the semiconductor die a logic core comprising a plurality of logic chains each interconnected for electrical communication between paired input pins and output pins of the integrated circuit device. Each of these logic chains comprises a plurality of scan-flops and a plurality of logic arrays, with each of the scan-flops including a serial input terminal, a multiplexer, a flip-flop provided with a flip-flop output, at least one data output terminal electrical coupled directly to the flip-flop output, and a scan output terminal interconnected to the flip-flop output by a logic gate.

Each of the logic arrays is electrically interconnected between the data output terminal of a preceding one of the scan-flops in the logic chain and the data input terminal of a succeeding one of the scan-flops in the logic chain. This methodology also incorporates the operation of electrically isolating the logic arrays from their associated scan-flops in the logic chain by coupling the scan output terminal of each preceding one of the scan-flops to the serial input terminal of each succeeding one of the scan-flops, thereby to reduce capacitive loading effects on the data output terminal of each flip-flop during testing mode operation and functional mode operation of the integrated circuit device.

Any of the operations described herein that form part of the invention are useful machine operations. The invention also relates to a device or an apparatus for performing these operations. The apparatus may be specially constructed for the required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A scan-flop having input terminals and adapted for use in testing integrity of an integrated circuit's core logic, comprising:

(a) a synchronous flip-flop having at least one input adapted to receive selected input data from said input terminals and an NQ output operative in response to presence of a clocked enable signal to exhibit a logic state as determined by the selected input data, said NQ output defining a data output terminal for said scan-flop;

(b) a logic circuit configured to receive an input lead having a length that is less than about ten (10) microns, said input lead of said logic circuit being electrically coupled to said NQ output, the logic circuit having an output node which defines a scan output terminal for said scan-flop, said scan output terminal being directly coupled to a serial input terminal of a succeeding scan-flop; and (c) a multiplexer operative in response to a select signal to transmit the selected input data to the input of said flip-flop.

2. A scan-flop according to claim 1 wherein said logic circuit is a gate element that decreases wiring capacitive loading when the integrated circuit is in a functional mode.

3. A scan-flop according to claim 2 wherein said logic circuit is an inverter.

4. A scan-flop according to claim 1 wherein said length is less than about 0.8 microns.

5. A scan-flop according to claim 1 wherein said flip-flop includes a pair of outputs each operative in response to a clocked enable signal to exhibit a logic state as determined by the selected input data, said outputs being logically inverted replicas of one another and said logic circuit electrically coupled to a selected one of said outputs to define the scan output terminal.

6. A scan-flop according to claim 5 wherein said logic circuit is an inverter.

7. A scan-flop according to claim 1 wherein said flip-flop is a D flip-flop.

8. A scan-flop circuit having a plurality of data input terminals, a select input terminal and a clock input terminal, said scan-flop adapted for use in testing integrity of an integrated circuit's core logic, comprising:

(a) a multiplexer having a plurality of multiplexer inputs in electrical communication with said data input terminals, a multiplexer select input in electrical communication with said select input terminal, and a multiplexer output, said multiplexer operative in response to a select signal present at said select input terminal to transmit data from one of said data input terminals;

(b) a synchronous flip-flop having a flip-flop input in electrical communication with said multiplexer output, a clock input in electrical communication with said clock input terminal and a plurality of flip-flop outputs, each of said flip-flop outputs defining a data output terminal for said scan-flop, said flip-flop operative in response to presence of a clocked enable signal at said clock input terminal to exhibit one of a first and second logic state as determined by said data; and (c) a logic gate having a n output node, said logic gate being electrically connected by an input lead between an NQ output which is one of said flip-flop outputs and its associated said data output terminal to define a scan output terminal for said scan-flop, said input lead having a length of less than about ten (10) microns, said scan output terminal being directly coupled to a serial input terminal of a succeeding scan-flop.

9. A scan-flop circuit according to claim 8 wherein said flip-flop is a D flip-flop and said logic gate is an inverter.

10. A scan-flop circuit according to claim 8 wherein said logic gate is configured to decrease a wire capacitance of the output terminal during a functional mode operation of the integrated circuit's core logic by having an extra output terminal identified as a scan output.

11. An integrated circuit device, comprising:

(a) a semiconductor or die;

(b) a plurality of input pins defined on said semiconductor die;

(c) a plurality of output pins defined on said semiconductor die; and (d) a logic core disposed within said semiconductor die, said logic core including a first logic chain electrically connected between paired ones of said input pins and output pins and operative in response to a clocked enable signal present at another of said input pins to receive selected input data and to generate output data at the paired one of said output pins, said logic chain including a first scan-flop, a second scan-flop and a logic array electrically interposed therebetween, each said scan-flop having a data input terminal, a select input terminal, a data output terminal and a scan output terminal, each said scan-flop including a synchronous flip-flop having at least a first flip-flop input adapted to receive selected input data and a plurality of flip-flop outputs, each responsive to the: clocked enable signal to exhibit a logic state as determined by the selected input data, a first one of said flip-flop outputs defining the data output terminal of its associated said scan-flop and a second one of said flip-flop outputs defining the scan output terminal of its associated said scan-flop, wherein the data output terminal of said first scan-flop is interconnected through said logic array to the data input terminal of said second scan-flop thereby to define a functional data path between the paired one of said input pins, and output pins, and wherein the scan output terminal of said first scan-flop is directly coupled to the select input terminal of said second scan-flop independently of said logic array thereby to define a logic gate scan path between the paired one of said input pins and output pins, said logic gate scan path being a logic circuit associated with each said flip-flop and electrically coupled between said second flip-flop output and said scan output terminal, wherein said logic circuit is configured to receive an input lead having a length that is less than about ten (10) microns, said integrated circuit device operative in a test mode to transmit selected input data in the form of a test vector to each said scan-flop along said logic gate scan path so that said logic array is bypassed, and further operative in a functional mode to transmit selected input data in the form of functional data through said logic chain along said functional data path for processing by said logic array.

12. An integrated circuit device according to claim 11 including a plurality of logic chains each respectively connected between paired ones of said input pins and output pins.

13. An integrated circuit device according to claim 11 wherein said logic circuit is configured to reduce wire loading effects on said second flip-flop output when said integrated circuit device is in the functional mode.

14. An integrated circuit device according to claim 13 wherein each logic circuit is a gate element.

15. An integrated circuit device according to claim 4 wherein each said logic output and said scan output terminal to reduce capacitive loading effect on the second flip-flop output when said integrated circuit device is in the functional mode.

16. An integrated circuit device according to claim 11 wherein each said scan-flop includes a multiplexer operative in response to a select signal to transmit one of said test vector and said functional data to said logic chain.

17. An integrated circuit device according to claim 11 wherein each said scan-flop includes a multiplexer operative in response to a select signal to transmit one of said test vector and said functional data to said logic chain.

18. An integrated circuit device, comprising:

(a) a semiconductor die;

(b) a plurality input pins defined on said semiconductor die;

(c) a plurality of output pins defined on said semiconductor die; and (d) a logic core formed in said semiconductor die and including a plurality of logic chains respectively interconnected for electrical communication between paired ones of said input pins and output pins, each of said logic chains operative to receive selected input data and to generate output data in response thereto, each of said logic chains including:

(i) a plurality of logic arrays;

(ii) a plurality of scan-flops each having a data input terminal, a data output terminal, a serial input terminal, and a scan output terminal, said scan output terminal of each of said scan-flops being directly coupled to said serial input terminal of each scan-flop that succeeds each of said scan-flops, each of said scan-flops including a synchronous flip-flop having a flip-flop input adapted to receive the selected input data and a plurality of flip-flop outputs each operative in response to presence of a clocked enable signal to exhibit a logic state as determined by the selected input data, a first one of said flip-flop outputs defining the data output terminal of its associated one of said scan-flops and a second one of said flip-flop outputs defining the scan output terminal of its associated one of said scan-flops, said scan-flops being electrically coupled independently of said logic arrays to define a logic gate scan path between the paired ones of said input pins and output pins, each of said logic gate scan path being a logic circuit associated with each said flip-flop, said logic circuit being configured to receive an input lead having a length that is less than about ten (10) microns, each of said logic gate scan path being electrically connected between said second flip-flop output and said scan output terminal, each of said logic arrays being electrically connected between adjacent ones of said scan-flops thereby to define a functional data path between the paired ones of said input pins and output pins, said integrated circuit device operative in a test mode to transmit selected input data in the form of a test vector to each of said scan-flops along said logic gate scan path so that said logic arrays are bypassed and further operative in a functional mode to transmit selected input data in the form of functional data through said logic chain along said functional data path for processing by said logic arrays.

19. An integrated circuit device according to claim 18, wherein each of said logic circuit is configured to reduce capacitive loading effect on the second flip-flop output when said integrated circuit device is in the functional mode.

20. An integrated circuit device according to claim 19 wherein each of said scan-flops includes a multiplexer operative in response to a select signal to transmit one of said test vector and said functional data to its associated flip-flop.

21. An integrated circuit device according to claim 19 wherein each said logic circuit is a power inverter.

22. An integrated circuit device according to claim 18 wherein each of said scan-flops includes a multiplexer operative in response to a select signal to transmit one of said test vector and said functional data to said logic chain.

23. A method of fabricating an integrated circuit device into a semiconductor die to maximize fault coverage thereof during test mode operation without sacrificing processing speed during functional mode operation, wherein said integrated circuit device includes a plurality of input pins and a plurality of output pins, comprising:

(a) forming into the semiconductor die a logic core comprising a plurality of logic chains each interconnected for electrical communication between paired ones of said input, pins and said output pins, each of said logic chains comprising a plurality of scan-flops and a plurality of logic arrays and each of said scan-flops including a serial input terminal, a data input terminal, a multiplexer, a flip-flop provided with a flip-flop output, at least one data output terminal electrically coupled directly to said flip-flop output, and a scan output terminal interconnected to said flip-flop output by a logic gate;

(b) electrically interconnecting each of said logic arrays between the data output terminal of a preceding one of said scan-flops in said logic chain and the data input terminal of a succeeding one of said scan-flops in said logic chain; and (c) electrically isolating said logic arrays from their associated scan-flops in said logic chain by directly coupling the scan output terminal of each said preceding one of said scan-flops to the serial input terminal of each succeeding one of said scan-flops by a logic gate configured to receive an input lead having a length that is less than ten (10) microns, thereby reducing capacitive loading effects on the data output terminal of each said flip-flop during testing mode operation and functional mode operation of the integrated circuit device.

* * * * *